United States Patent
Park et al.

[11] Patent Number: 6,031,785
[45] Date of Patent: Feb. 29, 2000

[54] RANDOM ACCESS MEMORY HAVING BURST MODE CAPABILITY AND METHOD FOR OPERATING THE SAME

[75] Inventors: Hee-Choul Park; Eun-Cheol Kim, both of Kyungi-do, Rep. of Korea

[73] Assignee: Samsung Electronics, Co., Ltd., Suwon, Rep. of Korea

[21] Appl. No.: 09/039,782

[22] Filed: Mar. 16, 1998

[30]   Foreign Application Priority Data

Mar. 15, 1997 [KR]  Rep. of Korea ........................ 97-8829

[51] Int. Cl.$^7$ ..................................................... G11C 8/00
[52] U.S. Cl. ................................ 365/230.08; 365/230.03; 365/189.04; 365/189.05
[58] Field of Search .............................. 711/105; 395/496, 395/432; 365/189.05, 233.5, 230.03, 230.09, 230.08, 189.04, 230.06

[56]   References Cited

U.S. PATENT DOCUMENTS

| | | | |
|---|---|---|---|
| 5,655,105 | 8/1997 | McLaury ................................. | 395/496 |
| 5,757,703 | 5/1998 | Merritt et al. ..................... | 365/189.05 |
| 5,875,452 | 2/1999 | Katayama et al. ...................... | 711/105 |

*Primary Examiner*—David Nelms
*Assistant Examiner*—Thong Le
*Attorney, Agent, or Firm*—Marger Johnson & McCollom, P.C.

[57]   ABSTRACT

A burst SRAM device is provided having a burst column selection circuit which is activated in accordance with a burst address, in addition to a column selection circuit for selecting columns of a memory cell array capable of storing a binary data. An internal column address portion of an external column address is applied to the column selection circuit as a first burst address signal. The column selection circuit selects at the same time at least two columns in response to the first burst address signal. During a burst read mode, at least two columns are simultaneously selected in response to the first burst address signal, and data stored in the selected cells are simultaneously sensed and amplified by at least two sense amplifiers corresponding to the selected memory cells. The data amplified thus are stored in a data output register. The burst addresses are applied to the burst column selection circuit. The burst column selection circuit allows the data stored in the data output register to be sequentially delivered to input/output data line pair in response to the burst addresses. As a result, an interval between a generation time of the first burst address and the time, which takes for a sensing operation of the last 1-bit data to be completed by the last burst address, can be considerably shortened as compared with the conventional device. During a burst write mode, at least two columns are simultaneously selected by the first burst address, and 1-bit data from the input/output data line pair corresponding to locations of the first burst address of the data input register are stored. The burst column selection circuit allows the data delivered sequentially from the data line pair to be sequentially stored in regions of the other burst addresses of the data input register in response to the other burst addresses. At least 2-bit data stored in the data input register are sequentially or simultaneously written in the selected memory cells of the selected columns.

21 Claims, 7 Drawing Sheets

Fig. 6B

RANDOM ACCESS MEMORY HAVING BURST MODE CAPABILITY AND METHOD FOR OPERATING THE SAME

FIELD OF THE INVENTION

The present invention relates to a high speed read/write scheme for a semiconductor memory device, and more particularly to a random access memory (RAM) device supporting a burst address accessing sequence mode, and a method for operating the same.

BACKGROUND OF THE INVENTION

In high powered PCs and workstations, processors as well as cache, graphics subsystems and high speed communications equipment demand better performance from memories. In order to meet this demand, memory manufacturers offer an array of innovative fast memory chips for various applications. Even though the speed and bandwidth of DRAM (dynamic RAM) and SRAM (static RAM) has improved greatly, there are still differences in the speeds required by different processors.

A burst mode is provided for high speed random access of DRAM and SRAM. During the burst mode, k-bit data of an external column address for burst address access sequence is captured as a first address of a $2^k$-bit burst access. Additionally, k-1 burst addresses are generated automatically for the rest of burst access. According to this burst operation, since there is no need to receive external addresses in every cycle, the load of a system bus can be reduced. Also, since addresses are generated internally, a data rate is improved.

Figure 1:
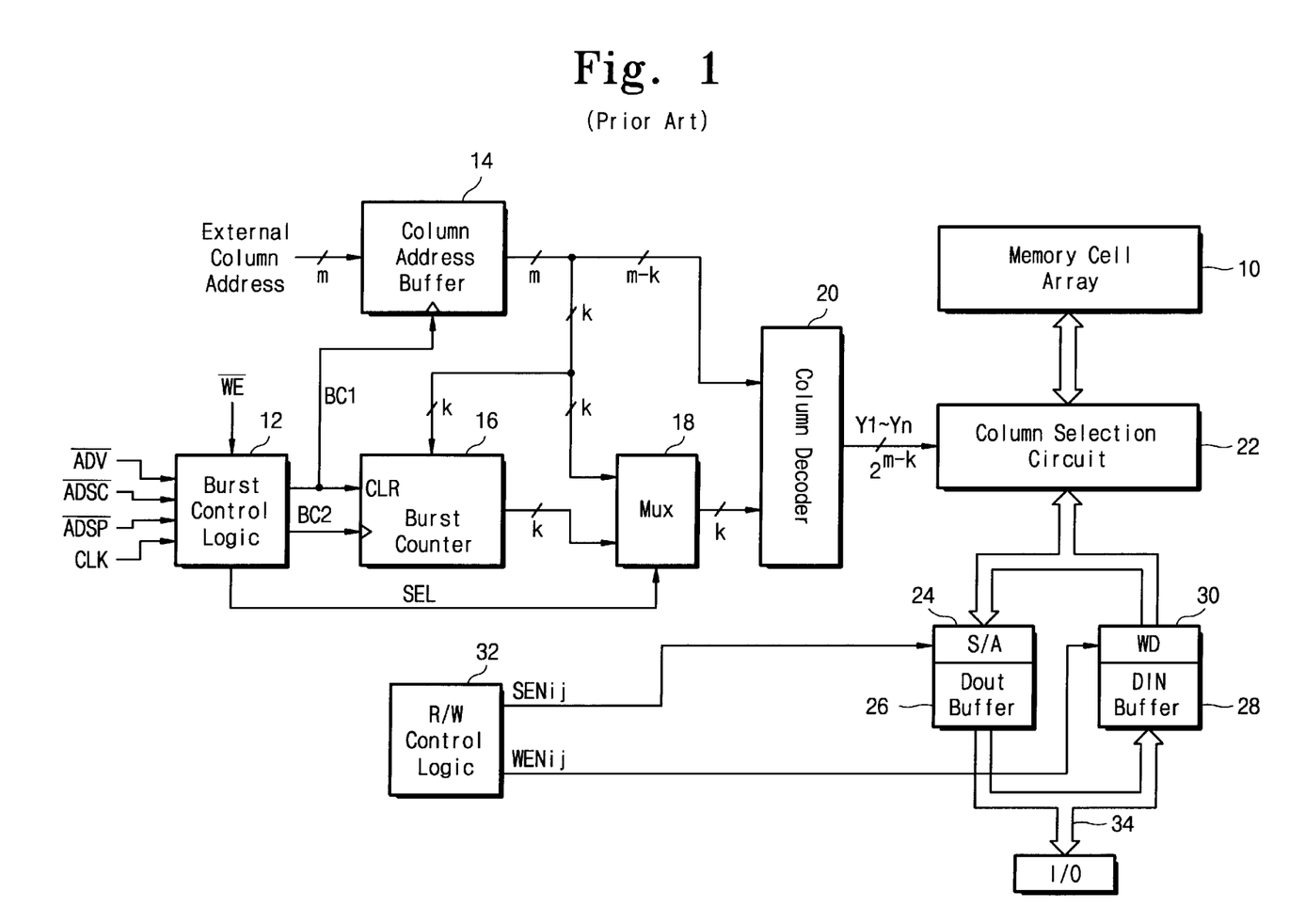
FIG. 1 is a block diagram showing a burst SRAM device in the prior art.

FIG. 1 is a block diagram showing a conventional synchronous burst SRAM device. The device is provided with a memory cell array 10, a column address buffer 14, a column decoder 20 and a column selection circuit 22. Buffer 14 receives an external column address and outputs an internal column address to decoder 20. The column decoder outputs a signal to column selection circuit 22 for selecting a column of the memory cell array.

The device also includes a sensing amplifying circuit 24 and a data output buffer 26 for the read operation. Additionally it includes a data input buffer 28 and a write drive circuit 30 for the write operation. A read/write control logic 32 generates signals SENij and WENij for controlling the read and write operations respectively.

The burst mode in the circuit of FIG. 1 is performed by a burst control logic 12, a burst counter 16, and a multiplexer 18. Burst control logic 12 receives external clock signal CLK and external mode signals $\overline{ADV}$, $\overline{ADSC}$, and $\overline{ADSP}$, and generates burst control signals BC1 and BC2 accordingly. Burst counter 16 is constituted by a k-bit binary counter. This counter is cleared by burst control signal BC1. Burst control signal BC2 is used as a clock signal.

When external write enable signal $\overline{WE}$ is 'H' (i.e., logical '1'), and processor address strobe signal $\overline{ADSP}$ is 'L' (i.e., logical '0'), or when both signals $\overline{WE}$ and $\overline{ADSP}$ are 'H' and signal $\overline{ADSC}$ is 'L', burst control logic 12 generates a burst control signal BC1 of 'L' and a burst control signal BC2 of 'H'. Then a k-bit column address signal from column address buffer 14 is loaded to burst counter 16. The k-bit column address signal thus loaded is used as a first address of the burst mode. Thus, a burst read cycle begins.

After that time, when signals $\overline{WE}$, $\overline{ADSP}$ and $\overline{ADSC}$ are 'H' and address advance signal $\overline{ADV}$ is 'L', the burst read cycle continues to be performed.

When signals $\overline{WE}$ and $\overline{ADSC}$ are 'L' and signal $\overline{ADSP}$ is 'H', burst control logic 12 generates a burst control signal BC1 of 'L' and a burst control signal BC2 of 'H'. A k-bit column address from column address buffer 14 is then loaded to burst counter 16. The address thus loaded is used as a first address of the burst mode. Thus, a burst write cycle begins.

After that time, when signals $\overline{WE}$ and $\overline{ADV}$ are 'L' and signals $\overline{ADSP}$ and $\overline{ADSC}$ are 'H', the burst write cycle continues to be performed. Burst counter 16 sequentially generates the burst addresses in accordance with a predetermined sequence.

As described above, during the burst mode, a selection signal SEL of 'H' is generated from burst control logic 12 to be applied to multiplexer 18. The output of burst counter 12 is delivered to column decoder circuit 20. Thus, during the burst mode, $2^k$ m-bit column address signals from column address buffer 14 and multiplexer 18 are sequentially applied to column decoder circuit 20. Column decoder circuit 20 decodes the column address signals in order, and then generates column selection signals Y1~Yn one by one. Column selection circuit 22 selects columns of memory cell array 10 in response to column selection signals Y1~Yn.

During the burst read mode, the burst addresses are generated in accordance with the predetermined burst sequence. At the same time, outputs SENij of read/write control logic 32 are activated. Data stored in the memory cells of the selected columns are sequentially sensed, amplified, and stored in data output buffer 26. If the burst read sequence is completed, the bits stored in buffer 26 are delivered simultaneously to input/output line pairs 34.

During the burst write mode, the data on input/output data line pairs 34 is stored in a data input buffer 28. The burst addresses are then generated in accordance with the predetermined burst sequence. At the same time, outputs WENij of read/write control logic 32 are activated. Thus, the data stored in buffer 28 is written sequentially in the memory cells of the selected columns.

On the other hand, when signals $\overline{ADSP}$, $\overline{ADSC}$ and $\overline{ADV}$ are 'H', the burst mode is suspended. Burst control logic 12 then generates a burst control signal BC1 of 'H' and a burst control signal BC2 of 'L'. Thus, column address buffer 14 receives new external column addresses, and burst counter 16 is cleared. Burst control logic 12 also generates a selection signal SEL of 'L'. This causes a k-bit signal from buffer 14 to be delivered to column decoder circuit 20 by multiplexer 18. In this case, the m-bit internal address signal from buffer 14 is provided directly to column decoder circuit 20.

In the conventional burst SRAM device of FIG. 1, since memory cells have to be accessed through column decoder circuit 20, a high speed burst counter logic must be used. If it is, an internal address access time such as a burst address access time, limits the speed of operation.

SUMMARY OF THE INVENTION

The present invention overcomes the limitations of the prior art. The invention provides a burst RAM device having an improved burst operation speed, and a method of operating the same.

A burst SRAM device of the present invention has a column selection circuit for selecting columns of a memory cell array capable of storing a binary data. In addition it has a burst column selection circuit which is activated in accordance with a burst address.

An internal column address portion of an external column address is applied to the column selection circuit as a first burst address signal or a base address signal. The column selection circuit selects at the same time at least two columns on the selected sections in response to the first burst address signal.

During a burst read mode, at least two columns are simultaneously selected in response to the first burst address signal, and data stored in the selected cells are simultaneously sensed and amplified by at least two sense amplifiers corresponding to the selected memory cells. The data amplified thus are stored in a data output register. The burst addresses are applied to the burst column selection circuit. The burst column selection circuit allows the data stored in the data output register to be sequentially delivered to input/output data line pair in response to the burst addresses. As a result, an interval between a generation time of the first burst address and the time, which takes for a sensing operation of the last 1-bit data to be completed by the last burst address, can be considerably shortened as compared with the conventional device.

During a burst write mode, at least two columns are simultaneously selected by the first burst address, and 1-bit data from the input/output data line pair corresponding to locations of the first burst address of the data input register are stored. The burst column selection circuit allows the data delivered sequentially from the data line pair to be sequentially stored in regions of the other burst addresses of the data input register in response to the other burst addresses. At least 2-bit data stored in the data input register are sequentially or simultaneously written in the selected memory cells of the selected columns. As a result, since the burst SRAM device of the present invention needs to decode only the column address signal used as the first burst address, a write decoding time of the device can be shortened as compared to the conventional memory device.

BRIEF DESCRIPTION OF THE DRAWINGS

This invention will be understood to those skilled in the art by reference to the accompanying drawings in which.

DETAILED DESCRIPTION OF PREFERRED EMBODIMENTS

Figure 2:
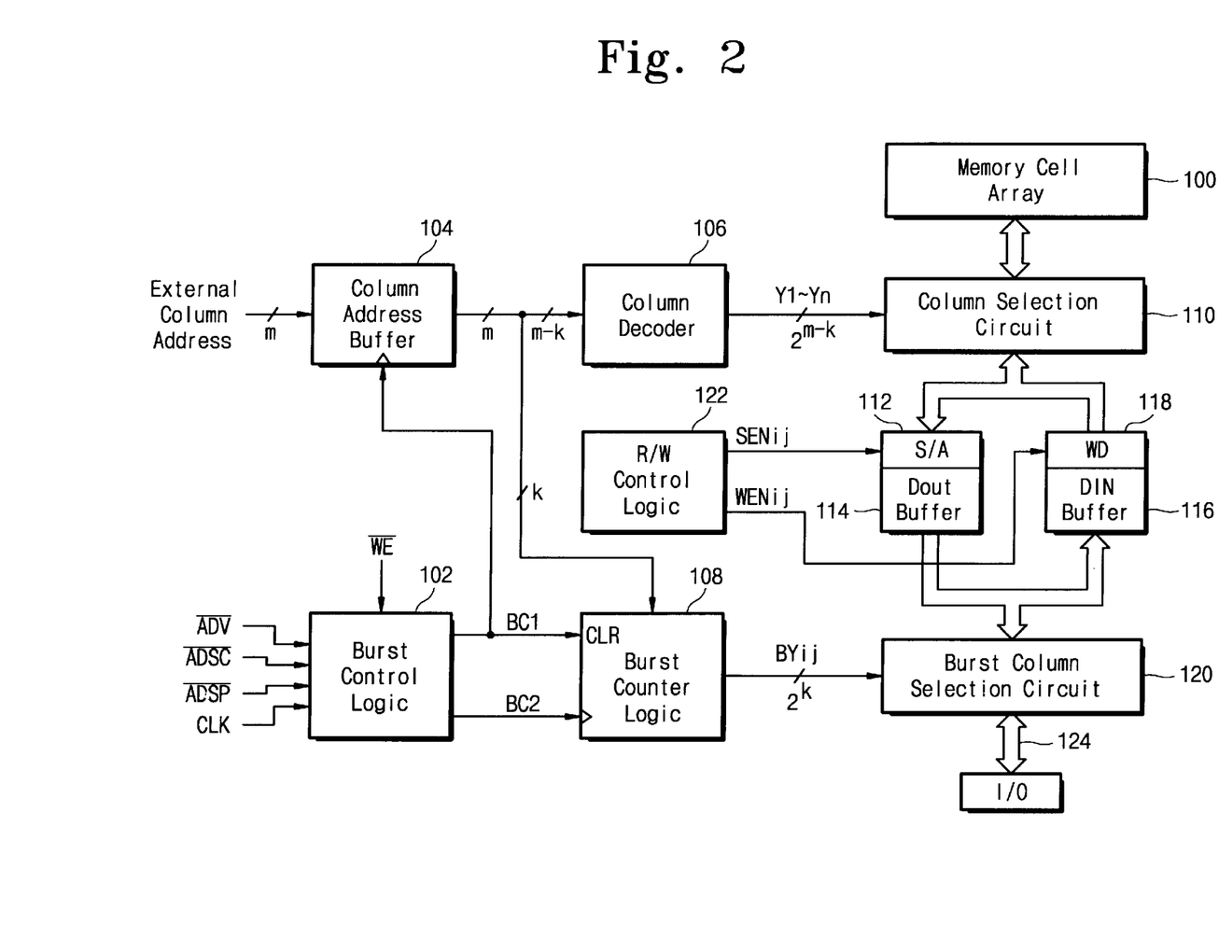
FIG. 2 is a block diagram showing a novel burst SRAM device made according to the present invention.

FIG. 2 shows a novel burst SRAM device according to the present invention. The device is provided with a memory cell array 100 that is subdivided in at least two blocks. Each block is subdivided in at least two sections.

The device also includes a column address buffer 104, a column decoder 106 and a column selection circuit 110. Buffer 104 receives an external column address and outputs an internal column address to decoder 106. The column decoder outputs a signal to column selection circuit 110 for selecting a column of the memory cell array.

The device also includes a sensing amplifying circuit 112 and a data output buffer 114 for the read operation. Additionally it includes a data input buffer 116 and a write drive circuit 118 for the write operation. A read/write control logic 122 generates signals SENij and WENij for controlling the read and write operations respectively.

The burst mode in the circuit of FIG. 2 is performed by a burst control logic 102, a burst counter logic 108, and a burst column selection circuit 120. Burst control logic 102 receives external clock signal CLK and external mode signals $\overline{ADSC}$, $\overline{ADSP}$ and $\overline{ADV}$, and accordingly generates pulse trains of burst control signals BC1 and BC2. Signal BC1 is generated when the external mode signals indicate a normal mode, and signal BC2 is generated when the external mode signals indicate a burst address accessing mode.

Column address buffer 104 receives an m-bit external column address when output BC1 of burst control logic 102 is 'H' (i.e., logical '1') and generates a m-bit internal column address.

Burst counter logic 108 may be constituted by a k-bit binary counter (not shown) and a logic for decoding outputs of the k-bit binary counter. Here k is an integer with a value between 1 and m inclusive. The burst counter logic may be constituted by a logic for decoding a k-bit signal of the m-bit internal column address from the column address buffer 104, a $2^k$-bit ring counter, and so forth.

Burst Address Accessing Mode

During a burst read mode, burst addresses are generated in accordance with a specific burst sequence, and at the same time outputs SENij are activated. Thus, p-bit data stored in memory cells of selected columns are sensed and amplified by sense amplifier circuit 112, and stored in data output buffer 114. The stored data is delivered onto input/output data line pairs 124 in accordance with a specific burst sequence, as is described in more detail below.

During a burst write mode, data from the respective input/output data line pairs 124 is stored in data input buffer 116 in accordance with a specific burst sequence. At the same time, outputs WENij of read/write control logic 122 are activated. As a result, the stored data is written onto the memory cells of selected columns by means of write drive circuit 118.

When an external write enable signal $\overline{WE}$ is 'H' and processor address strobe signal $\overline{ADSP}$ is 'L', or when both signals $\overline{WE}$ and $\overline{ADSP}$ are 'H' and controller address strobe signal $\overline{ADSC}$ is 'L', burst control logic 102 generates a burst control signal BC1 of 'H'. In response, a k-bit data of the m-bit output of column address buffer 104 is loaded to burst counter logic 108. The k-bit data thus loaded is used to generate a first burst address signal for the burst mode. As a result, a burst read cycle starts.

After that time, when all external mode signals $\overline{WE}$, $\overline{ADSC}$ and $\overline{ADSP}$ are 'H' and address advance signal $\overline{ADV}$ is 'L', burst control logic 102 generates a pulse train of burst control signal BC2 so that the burst read cycle continues to be performed.

As is well known in the art, burst sequences are classified into two types. The first is an interleaved burst sequence suitable for Intel type processors, and the second is a linear burst sequence suitable for Motorola type processors. As will be seen, both types can be implemented by the present invention.

In this description it is assumed for the sake of convenience that burst counter logic 108 comprises a 2-bit binary counter and a decoding logic, and receives a 2-bit column address '01' from the column address buffer 104. Using the interleaved burst sequence, the 2-bit counter of burst counter logic 108 sequentially generates '01' as a first output, '00' as a second output, '11' as a third output and '10' as the last output. If it were using the linear burst sequence, it would generate sequentially '01', '10', '11', and '00'.

The decoding logic of circuit 108 receives the output of the 2-bit counter, and generates four (=$2^2$) burst address signals BYi1~BYi4 in order, wherein i is the number of blocks constituting the memory cell array. Each of the burst address signals BYi1~BYi4 has two states, e.g., 'H' and 'L'.

When signals $\overline{WE}$ and $\overline{ADSC}$ are 'L' and signal $\overline{ADSP}$ is 'H', burst control logic 102 generates a burst control signal BC1 of 'H'. In response, a k-bit column address signal from column address buffer 104 is loaded to burst counter logic 108 and used to make a first burst address be generated. As a result, a burst write cycle starts.

After that time, when external write enable signal $\overline{WE}$ and address advance signal $\overline{ADV}$ are 'L', and controller address strobe signal $\overline{ADSC}$ and processor address strobe signal $\overline{ADSP}$ are 'H', burst control logic 102 generates a pulse train of burst control signal BC2 so that the burst write cycle continues to be performed. Burst counter logic 108 generates burst addresses BYij, wherein j is the number of blocks constituting the memory cell array. The addresses are generated in accordance with the preset sequence During the burst mode described above, the m-bit column address signal stored in column address buffer 104 is provided to column decoder circuit 106. Column decoder circuit 106 decodes the m-bit column address signal, and then allows one of column selection signals Y1~Yn to be activated. Column selection circuit 110 selects simultaneously a plurality of columns of the memory cell array in response to the activated column selection signal.

Normal Mode

When external mode signals $\overline{ADSC}$, $\overline{ADSP}$ and $\overline{ADV}$ are 'H', the burst mode is suspended. The burst control logic then generates a pulse train of burst control signal BC1 only. Column address buffer 104 receives the external column addresses in order, and generates the internal column addresses. Thus, a k-bit signal of each internal column address is loaded to burst counter logic 108, and also delivered to column decoder circuit 106.

Memory Blocks

Figure 3:
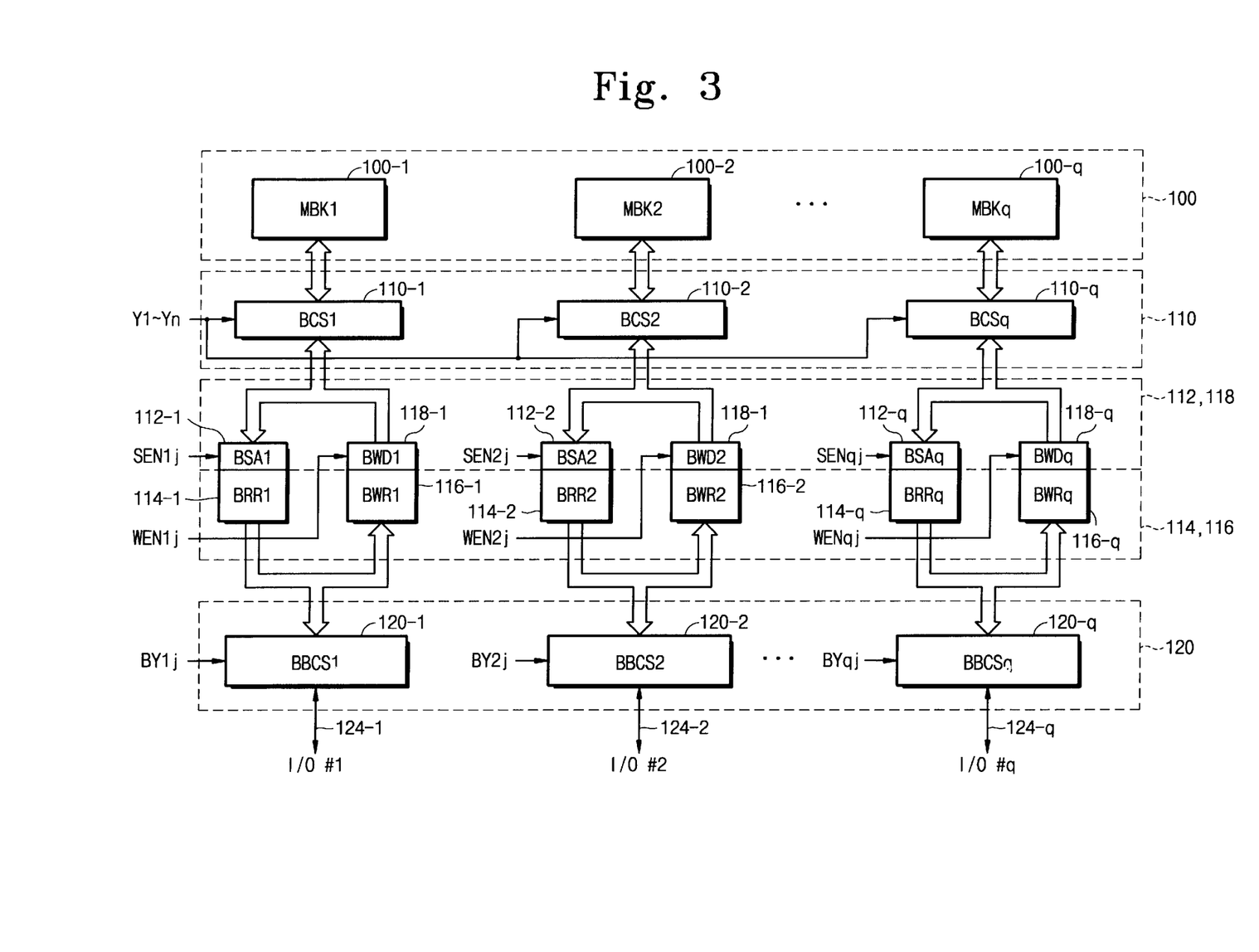
FIG. 3 is a block diagram showing in more detail a portion of the device shown in FIG. 2.

FIG. 3 shows a portion of an SRAM device made according to the present invention that includes the path of data. In this figure memory cell array 100 is divided into q memory blocks (memory banks) 100-1 (MBK1), 100-2 (MBK1), . . . , and 100-q (MBKq), wherein q is an integer of value 4, 9, 18, etc. It is understood that the value of q can be changed in accordance with system design.

Column selection circuit 110 is also divided into q block column selection circuits 110-1 (BCS1), 110-2 (BCS2), . . . , and 110-q (BCSq). The block column selection circuits are arranged corresponding to the memory banks respectively. Herein, an SRAM device having a memory cell array which is divided into at least two blocks will be illustrated as an example. However, the invention is not limited in the description and is applicable to memory devices having other cell array structures.

Column selection signals Y1~Yn, generated from the column decoder circuit, are applied to block column selection circuits 110-1, 110-2, . . . , and 110-q.

Each memory block is provided with peripheral circuitry. This includes a block sense amplifier circuit 112-x (BSA), a block read register 114-x (BRR), a block burst column selection circuit 120-x (BBCS), a pair of input/output data lines 124-x (I/O), a block write register 116-x (BWR), and a block write driver 118-x (BWD).

Further, block burst column selection circuit 120 is also divided into q block burst column selection circuits 120-1 (BBCS1), 120-2 (BBCS2), . . . , and 120-q (BBCSq). The block burst column selection circuits are arranged corresponding to the memory banks respectively. Burst address BY1j, generated from the burst counter, is applied to BBCS1 120-1, etc.

Memory Sections

Figure 4:
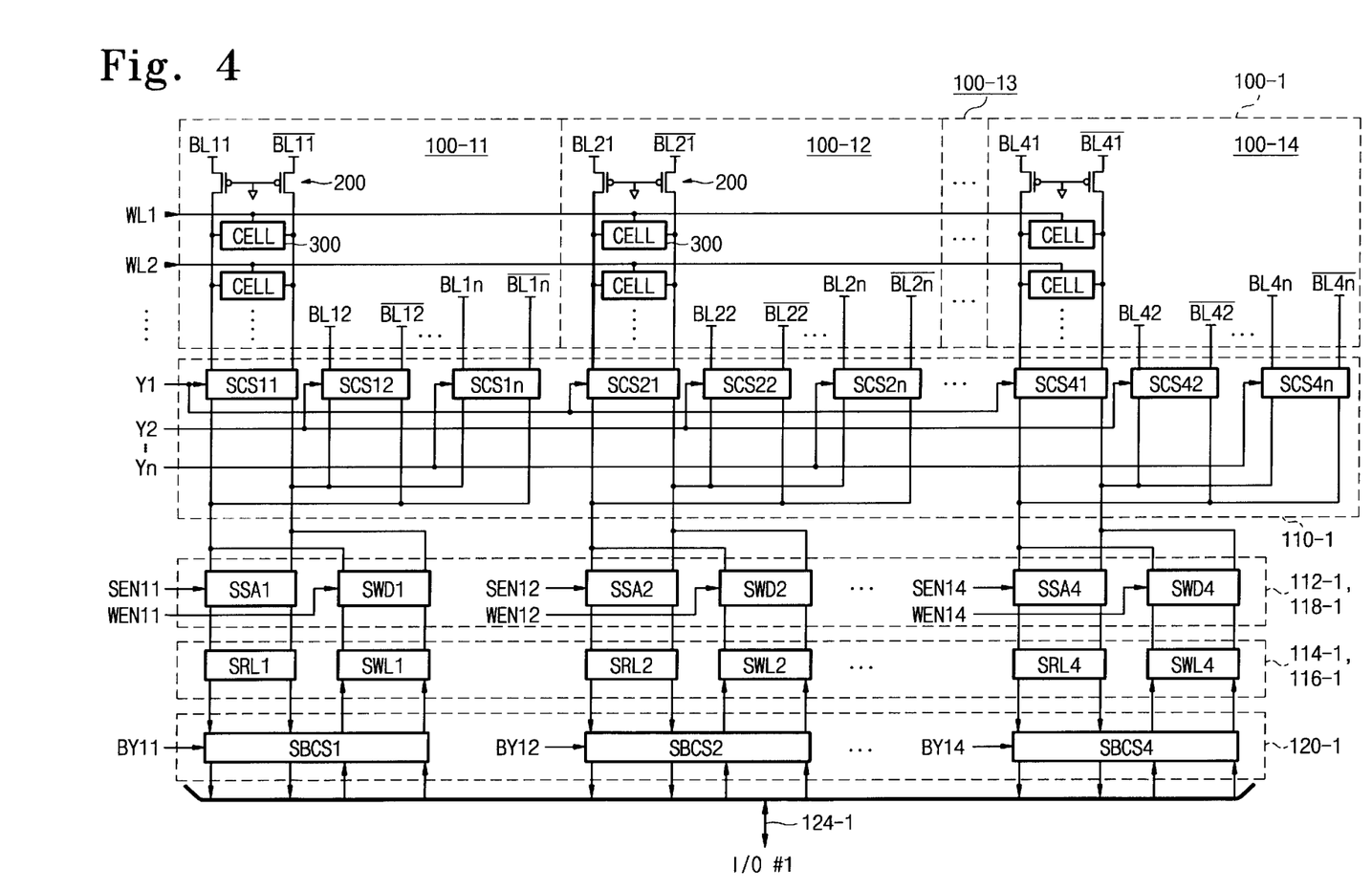
FIG. 4 is a diagram showing in more detail one of the memory blocks shown in FIG. 3 and its peripheral circuit.

FIG. 4 illustrates memory block 100-1 and its peripheral circuit as an example of those shown in FIG. 3. First block 100-1 is divided into four memory sections 100-11, 100-12, 100-13 and 100-14.

In each memory section, parallel word lines WL1, WL2, . . . , and WLr extend along rows transversely to the columns, and n bit line pairs (BLx1, $\overline{BLx1}$), (BLx2, $\overline{BLx2}$), . . . , and (BLxn, $\overline{BLxn}$) extend parallel to the columns. Bit line loads 200 are connected to the bit line pairs respectively. A plurality of memory cells 300 are arranged in a matrix at the crossing points between the word lines and the bit lines. Each cell is connected between corresponding word and bit lines. As is well known in this art, the word lines are selectively activated by a row decoder (not shown).

Block column selection circuit 110-1 is divided into section column selectors SCSx1, SCSx2, . . . , SCSxn. The section column selectors are connected to the bit line pairs of each section, respectively. Column selection signals Y1, Y2, . . . , Yn, generated by the column decoder circuit are applied to their respective section column selectors.

BSA 112-1 is divided into section sense amplifiers SSA1, SSA2, SSA3 and SSA4. The section sense amplifiers are provided to read out data from the sections of each memory block, and are controlled by sense enable signals SENx1~SENx4 generated by the read/write control logic.

BWD 118-1 is divided into section write drivers SWD1, SWD2, SWD3 and SWD4. The section write drivers are provided to write data in the sections, and are controlled by write enable signals WENx1~WENx4 generated by the read/write control logic.

Further, block column selection circuit 120-1 (BBCS1) is also divided into section burst column selectors SBCS1, SBCS2, SBCS3 and SBCS4. The section burst column selection circuits are arranged corresponding to bank sections 100-x1, 100-x2, 100-x3, 100-x4 respectively. Burst column selection signals BYx1, BYx2, BYx3 and BYx4, generated by the burst counter logic, are applied to their respective section burst column selectors.

Moreover, latches SRL1, SRL2, SRL3 and SRL4 are connected between the section sense amplifiers SSA1~SSA4 and the section burst column selectors SBCS1~SBCS4, respectively. Latches SRL1–4 constitute a block read register (BRR) 114-x.

Additionally, latches SWL1, SWL2, SWL3 and SWL4 are connected between the section burst column selectors and the section write drivers. Latches SWL1~SWL4 constitute a block write register (BWR) 116-x.

Detailed Circuit

Figure 5:
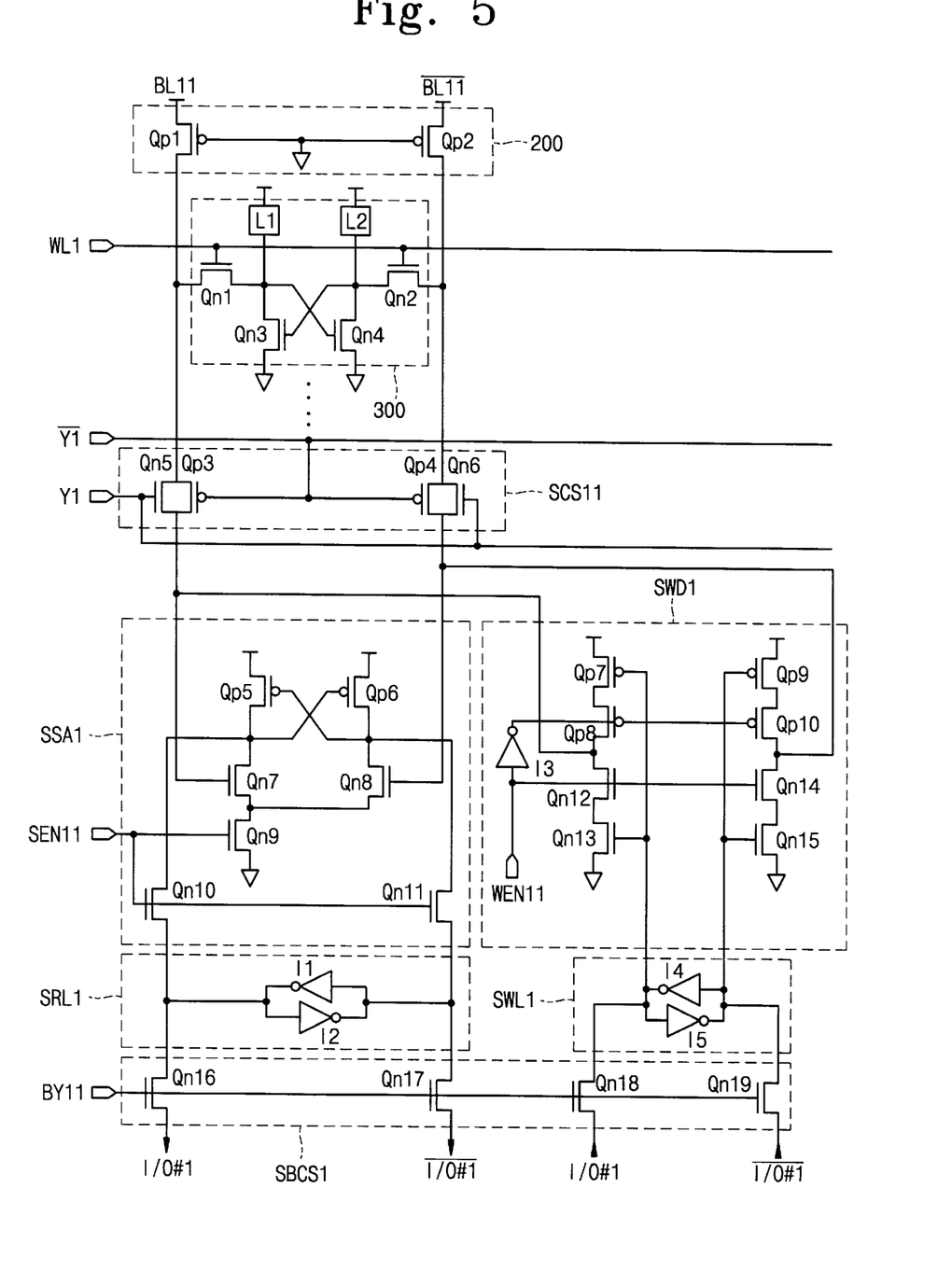
FIG. 5 is a detailed circuit diagram for one of the memory sections shown in FIG. 4 and its peripheral circuit.

Referring to FIG. 5, a circuit diagram is described for a combination of each memory section core and its peripheral circuit. For each one of sections 100-x1~100-xn of each block 100-x, PMOS transistors Qp1 and Qp2 are provided as bit line loads 200 on respective bit line pairs (BLx1, $\overline{BLx1}$), (BLx2, $\overline{BLx2}$), . . . , and (BLxn, $\overline{BLxn}$).

Each SRAM cell 300 is, as well known in the art, constituted by access or select transistors Qn1 and Qn2, storage transistors Qn3 and Qn4, and load elements L1 and L2. Gates of access transistors Qn1 and Qn2 of each cell 300 are connected to a corresponding word line WLx. A source-drain channel of transistor Qn1 is connected between a corresponding bit line BL11 and a gate of storage transistor Qn4. Additionally, a source-drain channel of transistor Qn2 is connected between a corresponding bit line $\overline{BL11}$ and a gate of storage transistor Qn3. Load element L1 is coupled between a supply voltage source and a gate of transistor Qn4, and load element L2 is coupled between the supply voltage source and a gate of transistor Qn3. PMOS transistors, depletion mode NMOS transistors, or polysilicon resistors may be used as load elements. A source-drain channel of transistor Qn3 is connected between a ground and load element L1, or between the ground and the gate of transistor Qn4. And a source-drain channel of the transistor Qn4 is coupled between the ground and load element L2 or between the ground and the gate of transistor Qn3.

A section column selector SCSxx is provided on the respective bit line pairs (BLx1, $\overline{BLx1}$), (BLx2, $\overline{BLx2}$), . . . , and (BLxn, $\overline{BLxn}$). Each section column selector SCSxx is constituted by two CMOS transmission gates (Qn5 and Qp3) and (Qn6 and Qp4).

A corresponding column selection signal Yx is applied to gates of NMOS transistors Qn5 and Qn6 of each section column selector SCSxx. And a signal $\overline{Yx}$, complementary to column selection signal Yx, is applied to gates of PMOS transistors Qp3 and Qp4 thereof. For example, as shown in FIG. 5, a column selection signal Y1 and a complementary signal $\overline{Y1}$ thereof are applied to first section column selector SCS11. A column selection signal Y2 and a complementary signal $\overline{Y2}$ thereof are applied, although not shown in FIG. 5, to each of second section column selectors SCS12, SCS22, SCS32 and SCS42 of sections 100-x1, 100-x2, 100-x3 and 100-x4 respectively. Similarly, a column selection signal Yn and a complementary $\overline{Yn}$ are respectively applied to n-th section column selectors SCS1n, SCS2n, SCS3n and SCS4n of sections 100-x1, 100-x2, 100-x3 and 100-x4 respectively.

Section sense amplifiers SSA1, SSA2, SSA3 and SSA4 are associated with and correspond to sections 100-x1, 100-x2, 100-x3 and 100-x4 of each block, respectively. Each section sense amplifier SSAx is a differential amplifier circuit which is constituted by two PMOS transistors Qp5 and Qp6 and five NMOS transistors Qn7, Qn8, Qn9, Qn10 and Qn11.

In each section sense amplifier SSAx, source-drain channels of transistors Qp5, Qn7 and Qn9 are connected in series between the supply power and the ground. And, source-drain channels of transistors Qp6 and Qn8 are connected in series between the supply power and a contact of transistors Qn7 and Qn9. A gate of transistor Qp5 is coupled with a contact of transistors Qp6 and Qn8, and a gate of transistor Qp6 is coupled with a contact of transistors Qp5 and Qn7. Gates of transistors Qn7 and Qn8 are electrically connected with a pair of bit lines selected by a corresponding section column selector SCSxx. A drain of transistor Qn10 is coupled with the contact of transistors Qp5 and Qn7, and a drain of transistor Qn11 is coupled with the contact of transistors Qp6 and Qn8.

As described above, sense enable signals SENx1 to SENx4 are applied to section sense amplifiers SSA1, SSA2, SSA3 and SSA4 respectively. More specifically, sense enable signals SENxx are applied to gates of transistors Qn9, Qn10 and Qn11 of each section sense amplifier SSAx. For example, a sense enable signal SEN11 is applied to gates of transistors Qn9, Qn10 and Qn11 in first section sense amplifier SSA1.

A section read latch SRLx is coupled to sources of transistors Qn10 and Qn11 of each sense amplifier SSAx. The section read latch is composed of two inverters I1 and I2 crosscoupled to each other.

Section write drivers SWD1, SWD2, SWD3 and SWD4 are associated with and correspond to sections 100-x1, 100-x2, 100-x3 and 100-x4 of each block, respectively. Each driver is composed of four PMOS transistors Qp7, Qp8, Qp9 and Qp10, four NMOS transistors Qn12, Qn13, Qn14 and Qn15, and an inverter I3. Source-drain channels of transistors Qp7, Qp8, Qn12 and Qn13 are connected in series between the supply power and the ground, and source-drain channels of transistors Qp9, Qp10, Qn14 and Qn15 are coupled in series between the supply power and the ground. Gates of transistors Qp7 and Qn13 are connected to each other, and gates of transistors Qp9 and Qn15 are connected to each other. A contact of transistors Qp8 and Qn12 and a contact of the transistors Qp10 and Qn14 are electrically coupled to a pair of bit lines selected by a corresponding column selector SCSxx.

A corresponding write enable signal SENxx is applied in common to gates of transistors Qn12 and Qn14, and to input terminal of the inverter I3. For example, write enable signals WEN11, WEN12, WEN13 and WEN14 are applied to first, second, third and fourth section write drivers SWD1, SWD2, SWD3 and SWD4, which correspond respectively to sections 100-11, 100-12, 100-13 and 100-14 of first block 100-1. An output of inverter I3 is applied to gates of transistors Qp8 and Qp10.

A section write latch SWLx is connected between the gates of transistors Qp7 and Qn13, and the gates of transistors Qp9 and Qn15 of each section write driver SWDx. The section write latch is constituted by two inverters I4 and I5 cross-coupled to each other.

Section burst column selectors SBCS1, SBCS2, SBCS3 and SBCS4 are associated with and correspond to sections 100-x1, 100-x2, 100-x3 and 100-x4 of each block, respectively. Each section burst column selector SBCSx comprises four NMOS transistors Qn16, Qn17, Qn18 and Qn19.

In each burst column selector SBCSx, a source-drain channel of transistor Qn16 is connected between a terminal of corresponding latch SRLx and a corresponding input/output line I/O#x. And, between the other terminal of corresponding latch SRLx and corresponding input/output line $\overline{I/O\#x}$, there is coupled a source-drain channel of transistor Qn17. The pair of Qn16 and Qn17 are also known as first burst column selector.

Also, a source-drain channel of transistor Qn18 is connected between a terminal of corresponding latch SWLx and the corresponding input/output line I/O#x. And, between the other terminal of corresponding latch SRLx and corresponding input/output line $\overline{I/O\#x}$, there is coupled a source-drain channel of transistor Qn19. The pair of Qn18 and Qn19 are also known as second burst column selector.

A burst address signal BYxx is applied to gates of transistors Qn16, Qn17, Qn18 and Qn19. For example, burst address signals BY11, BY12, BY13 and BY14 are applied to first through fourth section burst selectors SBCS1, SBCS2, SBCS3 and SBCS4 corresponding respectively to sections 100-11, 100-12, 100-13 and 100-14 of a first block 100-1.

Read Operation

Figure 6A:
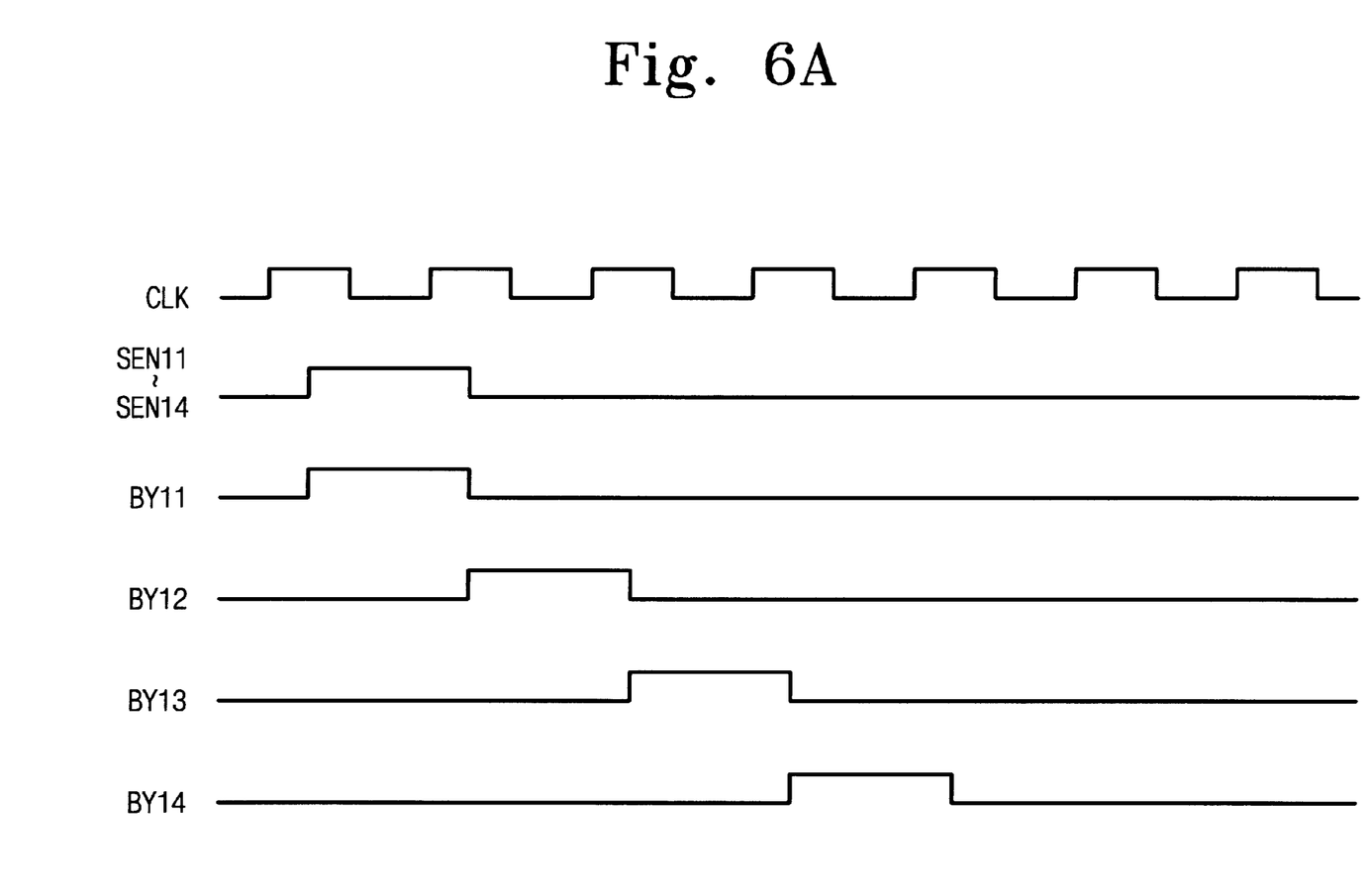
FIG. 6A is a timing chart illustrating a burst read operation of the device shown in FIG. 2.

The read operation of the device of the invention is now described with reference to FIGS. 2 through 6A. FIG. 6A is a timing chart illustrating a burst read operation of the burst SRAM device shown in FIG. 2.

In this description it is assumed for the sake of convenience that a predetermined 2-bit signal of the column address from the column address buffer 104 is provided to the burst counter logic 108.

When external write enable signal $\overline{WE}$ is 'H' and processor address strobe signal $\overline{ADSP}$ is 'L', or when signals $\overline{WE}$ and $\overline{\text{ADSP}}$ are 'H' and controller address strobe signal $\overline{\text{ADSC}}$ is 'L', burst control logic 102 generates a burst control signal BC1 of 'H'. In response, a 2-bit signal of the m-bit column address signal is loaded from column address buffer 104 to burst counter logic 108. If output Y1 of column decoder circuit 120 is activated by the m-bit column address, then each one of section column selectors SCS11, SCS21, SCS31 and SCS41 in memory block 100-1 selects one of n columns (i.e., bit line pairs) of a corresponding section. At the same time, burst counter logic 108 (using the loaded 2-bit signal) activates the first burst address signal (i.e., BY11), while read/write control logic 122 activates sense enable signals SEN11~SEN14. While four sense enable signals are being described here, in general they are p in number where p is an integer.

Each of section sense amplifiers SSA1~SSA4 amplifies a 1-bit data stored in a selected cell on the selected column of a corresponding section in response to a corresponding sense enable signal. As a result, the 4-bit data are simultaneously amplified by section sense amplifiers SSA1–SSA4, and stored in 4-bit block read register 114-1.

In more detail, if row address 1 is selected by a word line WL1, a 1-bit data stored in cell 300 is delivered through section column selector SCS11 and section sense amplifier SSA1 to 1-bit section read latch SRL1 to be latched. This latched data is delivered through section burst selector SBCS1 to a corresponding input/output data line pair I/O#1 and $\overline{\text{I/O\#1}}$. Similarly, the other 3-bit data (stored in the other 3 cells on the column selected by column selection signal Y1 and the row selected by word line WL1) are delivered and latched in 1-bit section read latches SRL2, SRL3 and SRL4.

After that time, when signals $\overline{\text{WE}}$, $\overline{\text{ADSP}}$ and $\overline{\text{ADSC}}$ are 'H' and address advance signal $\overline{\text{ADV}}$ is 'L', burst control logic 102 generates a pulse train of burst control signal BC2. This causes burst counter logic 108 to generate additional signals. Particularly, burst address signals BY12~BY14 are activated sequentially, and thereby the 3-bit data stored in section read latches SRL2~SRL4 are delivered sequentially to input/output data line pair I/O#1 and $\overline{\text{I/O\#1}}$ one by one. As can be seen, data output buffer 114-1 is provided to hold data as parallel, and burst column selection circuit 120-1 is provided to deliver it to its respective input/output line pairs 124-1 sequentially, i.e. in serial form.

The read cycle time of the read operation of the invention is considerably shorter compared to that of the conventional method. Specifically, the time interval between generating the first burst address and completing sensing of the last 1-bit data by the last burst address is almost half as long as that of the conventional read method.

Write Operation

Figure 6B:
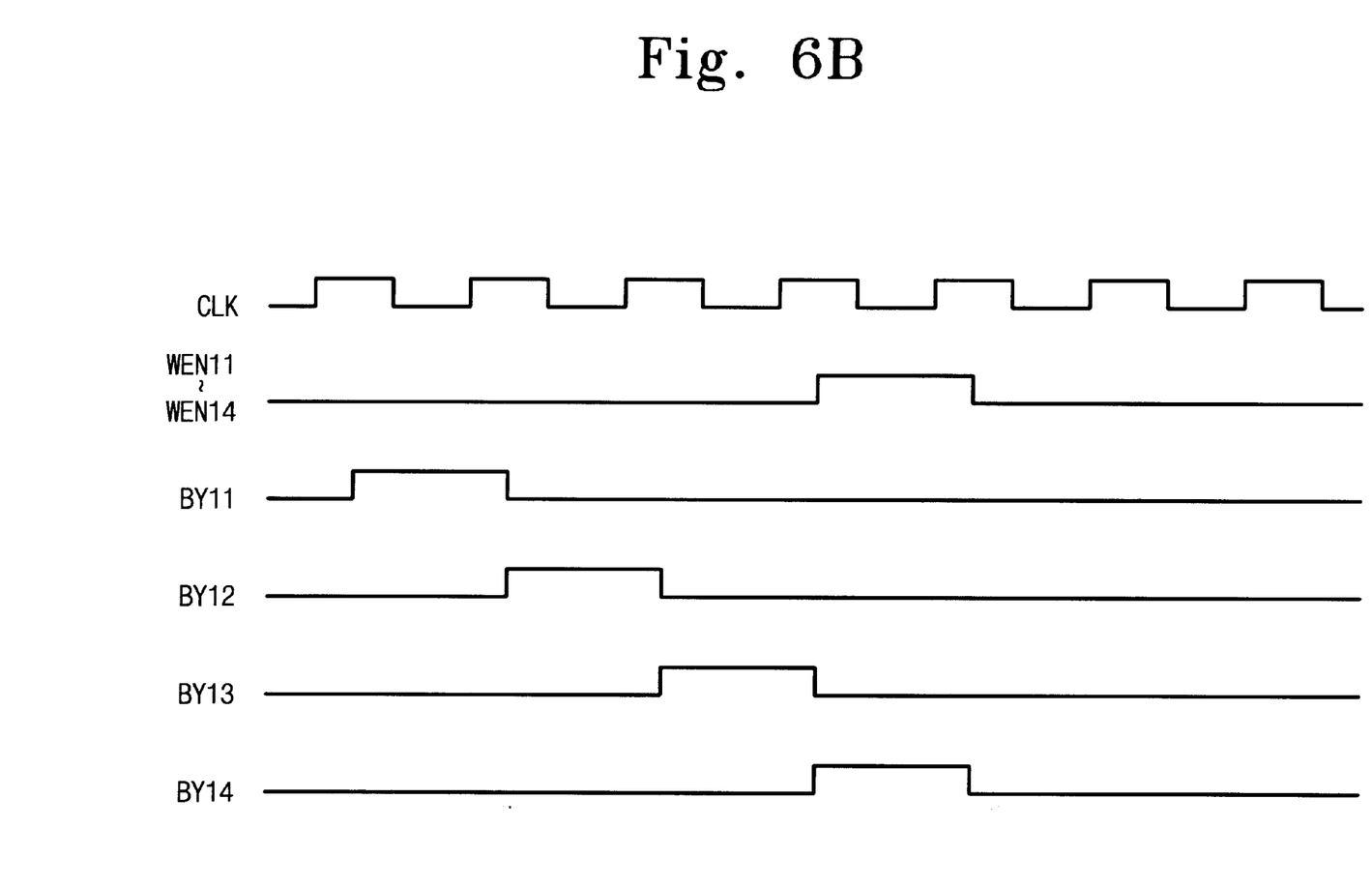
FIG. 6B is a timing chart illustrating a burst write operation of the device shown in FIG. 2.

The write operation of the device of the invention is now described with reference to FIGS. 2 through 5, and 6B. FIG. 6B is a timing chart illustrating a burst write operation of the burst SRAM device shown in FIG. 2.

When external write enable signal $\overline{\text{WE}}$ and controller address strobe signal $\overline{\text{ADSC}}$ are 'L' and processor address strobe signal $\overline{\text{ADSP}}$ is 'H', burst control logic 102 generates a burst control signal BC1 of 'H'. In response, a 2-bit signal of the m-bit column address signal is loaded from column address buffer 104 to burst counter logic 108. If the output Y1 of column decoder circuit 120 is activated by the m-bit column address, each one of section column selectors SCS11, SCS21, SCS31 and SCS41 selects one of n columns (i.e., bit line pairs) of a corresponding section. At the same time, burst counter logic 108, using the loaded 2-bit signal, activates the first burst address signal (BY11). A 1-bit data from the corresponding input/output data line pair I/O#1 and $\overline{\text{I/O\#1}}$ is delivered through section column burst selector SBCS1 to 1-bit section write latch SWL1, where it is stored.

After that time, when signals $\overline{\text{WE}}$ and $\overline{\text{ADV}}$ are 'L' and signals $\overline{\text{ADSP}}$ and $\overline{\text{ADSC}}$ are 'H', burst control logic 102 generates a pulse train of burst control signal BC2. This causes burst counter logic 108 to generate additional signals. Particularly, burst address signals BY12~BY14 are activated sequentially. Thus, the second 1-bit data on input/output data line pair I/O#1 and $\overline{\text{I/O\#1}}$ is delivered through section column burst selector SBCS2 to the 1-bit section write latch SWL2, where it is stored. Then the third, and then the fourth 1-bit data thereon are delivered sequentially through section column burst selectors SBCS3 and SBCS4 respectively to 1-bit section write latches SWL3 and SWL4.

Then write/read control logic 122 generates internal write enable signals WEN11~WEN14. These signals are generated simultaneously or sequentially, and in the general case are p in number. Block write driver 118-1, consisting of section write drivers SWD1~SWD4, allows the 4-bit data stored in block write register 116-1 to be written simultaneously in the selected cells through block column selection circuit 110-1. The block write register 116-1 has latches SWL1~SWL4 and the block column selection circuit has section column selectors SCS11, SCS21, SCS31 and SCS41. As can be seen, burst column selection circuit 120 is provided to receive data sequentially (i.e. in serial form) from input/output line pairs 124 in response to burst address signal BYij, and data input buffer 116 is provided to store this data in parallel form.

As described above, since the memory device of the present invention needs to decode a column address signal used as a first burst address, a write decoding time of the memory device can be shortened to be a quarter as long as that of the conventional memory device. Accordingly, burst read/write operation of the memory device can be considerably improved.

Also, since internal write enable signals can be simultaneously activated together with corresponding burst address signals, there is no need to provide a data input register for the memory device of the present invention.

What is claimed is:

1. A random access memory (RAM) device supporting a burst address accessing sequence mode comprising:

a memory cell array divided into at least two memory blocks for storing binary data, each of said memory blocks having at least two memory sections, each memory section having a plurality of word lines extending along rows and a plurality of bit line pairs extending along columns, the word lines defining crossing points with the bit line pairs, each memory section further having a plurality of memory cells arranged at the crossing points;

a burst control logic for generating a first burst control signal when an external mode signal is indicative of a normal mode, and a second burst control signal when an external mode signal is indicative of a burst address accessing sequence mode;

an address buffer for receiving an external column address signal in response to the first burst control signal, and for generating an internal column address signal;

a column decoder circuit for generating a plurality of column selection signals in response to the internal column address signal;

a column selection circuit for selecting one of the bit line pairs in each of the memory sections in response to the column selection signals, thereby causing data stored in a memory cell at a crossing point of the selected bit line pair to become present in the selected bit line pair;

a burst counter logic for receiving a portion of the internal column address signal in response to the first burst control signal, and sequentially generating at least two burst address signals in response to the second burst control signal;

a read control logic for generating at least two sense enable signals during a read operation of the RAM device;

an input/output line pair associated with each memory section;

a sense amplifier associated with each memory section, for sensing and amplifying data present in the selected bit line pair in response to the sense enable signal;

a 1-bit latch associated with each sense amplifier, for latching data amplified by the associated sense amplifier; and a burst column selector associated with each memory section, for electrically connecting the 1-bit latch associated with each sense amplifier to the input/output line pair in response to the burst address signals.

2. The RAM device of claim 1, further comprising:

a write control logic for generating at least two write enable signals during a write operation of the device;

a 1-bit write latch associated with each memory section; and a write driver associated with each memory section, wherein the burst column selector is further capable of electrically connecting the 1-bit write latch to the input/output line pair in response to the burst address signals thereby storing data present in the input/output line pair in the 1-bit write latch, and the write driver writes data stored in the 1-bit write latch to a memory cell at a crossing point of the selected bit line pair in response to the write enable signals.

3. The RAM device of claim 1, wherein each of said memory cells is a static RAM cell.

4. The RAM device of claim 2, wherein said write enable signals corresponding to the memory sections are generated simultaneously.

5. The RAM device of claim 2, wherein said write enable signals corresponding to the memory sections are generated sequentially.

6. A semiconductor random access memory (RAM) device comprising:

a memory cell array having a plurality of memory cells arranged in a matrix of rows and columns;

a first generating means for generating a burst control signal in response to a plurality of external mode signals;

a second generating means for generating an m-bit internal address signal in response to the burst control signal, where m is an integer;

a third generating means for generating n column selection signals in response to the internal address signal, where n is an integer equal to $2^m$;

selecting means for simultaneously selecting at least two columns of the columns in response to the column selection signals;

a first receiving means for receiving a k-bit signal of the internal address signal in response to the burst control signal to generate burst address signals having the same number as the number of selected columns, where k is an integer, and $1 \leq k \leq m$;

a fourth generating means for generating p sense enable signals used to read data from the selected columns, where p is an integer;

an input/output line pair;

sensing means for simultaneously sensing and amplifying internal data stored in selected memory cells of the selected columns in response to the sense enable signals; and converting means for converting an amplified internal data into a serial data and delivering the serial data to the input/output line pair.

7. The semiconductor RAM device of claim 6, wherein said converting means for converting the amplified data into the serial data comprises storage means for temporarily storing the amplified internal data.

8. The semiconductor RAM device of claim 6, further comprising:

a second receiving means for sequentially receiving the serial data of the input/output line pair and converting the serial data into a parallel data;

a fifth generating means for generating p write enable signals used to write data to the selected columns, where p is an integer; and enabling means for enabling the parallel data to be written in the selected memory cells in response to the write enable signals.

9. The semiconductor RAM device of claim 8, wherein said enabling means enables the parallel data to be simultaneously written in the selected memory cells when the write enable signals are simultaneously activated.

10. The semiconductor RAM device of claim 8, wherein said enabling means enables the parallel data to be sequentially written in the selected memory cells when the write enable signals are sequentially activated.

11. The semiconductor RAM device of claim 6, wherein said burst address generating means generates the burst address signals in response to a linear sequence.

12. The semiconductor RAM device of claim 6, wherein said burst address generating means generates the burst address signals in response to an interleaved sequence.

13. The semiconductor RAM device of claim 6, wherein each of said memory cells is a static RAM cell.

14. A reading method of a semiconductor random access memory (RAM) device which receives an external address signal for a predetermined burst address access sequence and sequentially generates burst address signals for the burst address access sequence, said method comprising the steps of:

selecting at least two memory cells in response to the external address signal;

sequentially sensing and amplifying data of the selected memory cells;

temporarily storing the amplified data; and sequentially delivering data stored in locations addressed by the burst address signals to a input/output data line.

15. A writing method of a semiconductor random access memory (RAM) device which receives an external address signal for a predetermined burst address access sequence and sequentially generates burst address signals for the burst address access sequence, said method comprising the steps of:

sequentially receiving data from an input/output data line to store the received data in locations addressed by the burst address signals;

simultaneously selecting at least two memory cells in response to the external address signal; and simultaneously writing the stored data in the selected memory cells.

16. A semiconductor random access memory (RAM) device comprising:

a memory cell array having a plurality of memory cells arranged in rows and columns;

a first receiving means for receiving a plurality of external mode signals and generating a burst control signal;

selecting means for simultaneously selecting $2^k$ of the columns in response to a column address signal, where k is an integer of more than one;

a second receiving means for receiving a k-bit signal of the column address signal in response to the burst control signal and generating $2^k$ burst address signals;

a generating means for generating a sense enable signal during a read operation of the device and generating a plurality of write enable signals during a write operation thereof;

a data line pair for delivering an 1-bit data;

sensing means for simultaneously sensing and amplifying data stored in selected memory cells of selected columns in response to the sense enable signal;

latching means for latching the amplified data;

delivery means for sequentially delivering the latched data to the data line pair in response to the burst address signals; and writing means for writing data from the data line pair in the selected memory cells in response to the burst address and write enable signals.

17. The semiconductor RAM device of claim 16, wherein said writing means comprises:

a $2^k$ bit register;

a burst column selection circuit for sequentially delivering a $2^k$ bit data from the data line pair to the register in response to the burst address signal; and a write driver circuit for writing the $2^k$ bit data stored in the register in the selected memory cells when the write enable signal is activated.

18. The semiconductor RAM device of claim 17, wherein said write enable signals are simultaneously activated.

19. The semiconductor RAM device of claim 17, wherein said write enable signals are sequentially activated.

20. The semiconductor RAM device of claim 16, wherein each of said memory cells is a SRAM cell.

21. A memory device supporting a burst address accessing sequence mode, comprising:

a memory cell array divided into at least two memory blocks for storing binary data, each of said memory blocks having at least two memory sections, each memory section having a plurality of word lines extending along rows and a plurality of bit line pairs extending along columns, the word lines defining crossing points with the bit line pairs, each memory section further having a plurality of memory cells arranged at the crossing points;

a burst control logic for generating a first burst control signal when at least one external mode signal is indicative of a normal mode, and a second burst control signal when the external mode signal is indicative of a burst address accessing sequence mode;

an address buffer for receiving an external column address signal in response to the first burst control signal, and for generating an internal column address signal;

a column decoder circuit for generating a plurality of column selection signals in response to the internal column address signal;

a column selection circuit for selecting one of the bit line pairs in each of the memory sections in response to the column selection signals, thereby causing data stored in a memory cell at a crossing point of the selected bit line pair to become present in the selected bit line pair;

a burst counter logic for receiving a portion of the internal column address signal in response to the first burst control signal, and sequentially generating at least two burst address signals in response to the second burst control signal;

a write control logic for generating at least two write enable signals during a write operation of the device;

an input/output line pair associated with each memory section;

a 1-bit write latch associated with each memory section;

a write driver associated with each memory section; and a burst column selector associated with each memory section, for electrically connecting the 1-bit write latch to the input/output line pair in response to the burst address signals, thereby storing data present in the input/output line pair in the 1-bit write latch, wherein the write driver writes data stored in the 1-bit write latch to a memory cell at a crossing point of the selected bit line pair in response to the write enable signals.

* * * * *

UNITED STATES PATENT AND TRADEMARK OFFICE
CERTIFICATE OF CORRECTION

PATENT NO.   : 6,031,785
DATED        : February 29, 2000
INVENTOR(S)  : Park et al.

It is certified that error appears in the above-identified patent and that said Letters Patent is hereby corrected as shown below:

Column 5,
Line 46, "100-2(MBK1)" should read -- 100-2(MBK2) --.

Column 9,
Line 20, "SSA1-SSA4" should read -- SSA1~SSA4 --.

Column 11,
Line 62, "2m" should read -- 2m-k, where k is an integer and m☐k☐1 --.

Column 12,
Lines 2-3, "columns, where k is an integer and m≦k≦1;" should read -- columns; --.

Signed and Sealed this

Twenty-second Day of October, 2002

Attest:

JAMES E. ROGAN
Attesting Officer    Director of the United States Patent and Trademark Office